Aug. 21, 1956 G. F. ROGERS 2,760,059
AUTOMATIC GAIN CONTROL CIRCUITS
Filed March 23, 1955
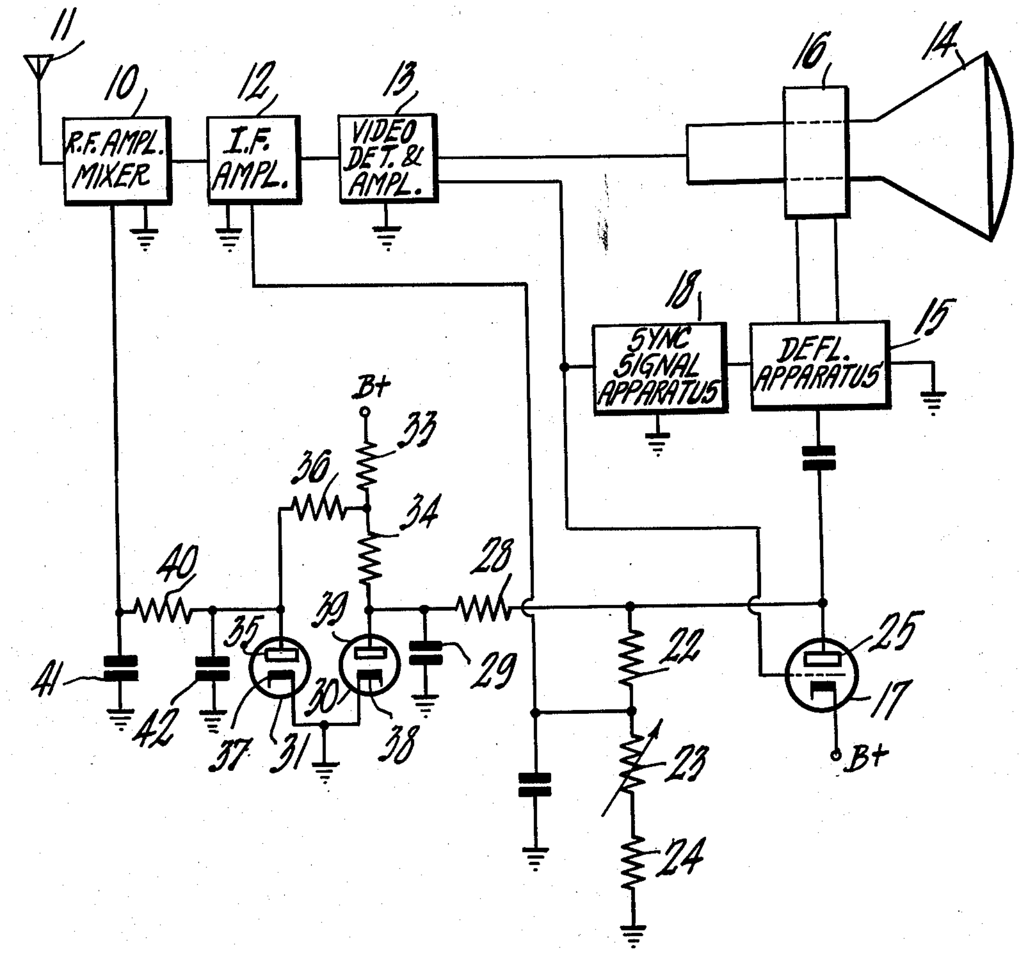
INVENTOR.
Gordon F. Rogers
BY
[signature]
ATTORNEY United States Patent Office 2,760,059 Patented Aug. 21, 1956

2,760,059

AUTOMATIC GAIN CONTROL CIRCUITS

Gordon F. Rogers, Lincolnwood, Ill., assignor to Radio Corporation of America, a corporation of Delaware Application March 23, 1955, Serial No. 496,270

8 Claims. (Cl. 250—20)

The present invention relates generally to automatic gain control circuits and particularly to automatic gain control circuits for use in radio signal receiving systems to apply automatic gain control voltages of different magnitudes and at different rates to separate portions of the radio signal receiving system.

In signal receiving systems adapted for receiving amplitude modulated carrier waves, it is desirable to provide an automatic gain control (AGC) potential which is produced as a function of the average carrier wave intensity of the received radio signal to control the gain of the system as an inverse function of the intensity.

It has further been found that the application of the same or equal automatic gain control voltages to the radio frequency and intermediate frequency signal amplifier stages of a receiving system may result in the overload in the tuner or intermediate frequency signal amplifier stages on strong signal conditions and it has also been found that the noise factor of the receiving system degrades with increasing bias. The disadvantages may be reduced or overcome by providing an automatic gain control system wherein substantially no automatic gain control voltage is applied to the radio frequency signal amplifier stage until the signal is strong enough to completely override all noise.

For signals stronger than necessary to override all noise the bias voltage applied to the radio frequency amplifier stage is rapidly increased so that for very strong signals the bias is greater than that applied to the intermediate frequency amplifier stages. With some systems of this type, however, it has been found difficult to maintain the AGC voltage applied to the radio frequency stage at a sufficiently low value during low or weak signal voltage conditions.

It is accordingly an object of the present invention, to provide an improved automatic gain control system for applying accurately controlled automatic gain control voltages of different magnitudes to different portions of a radio receiving system.

It is a further object of the present invention, to provide an automatic gain control system wherein maximum useable signal to noise ratio of a radio receiving system may be accurately maintained during low signal level conditions and whereby the gain of the radio receiving system may be appropriately altered as an inverse function of the signal level to prevent an overload of a portion of the receiving system.

It is another object of the present invention, to provide an automatic gain control system for controlling the various portions of the radio receiving system to a different degree whereby to maintain a favorable noise factor and sensitivity without undue overload of any portion of the receiving system through a wide range of level of a received signal wave.

In accordance with the present invention, a variable impedance circuit is provided for altering the percentage of automatic gain control voltage to be applied to the radio frequency signal amplifier stage of a radio receiving system which is actuated by the automatic gain control voltage to establish two sharply distinct operating regions and having a threshold corresponding to a predetermined discrete automatic gain control level.

The novel features that are considered characteristic of this invention are set forth with particularity in the appended claims. The invention, itself, however, both as to its organization and method of operation, as well as additional objects and advantages thereof, will best be understood from the following description when read in connection with the accompanying drawings, in which the single figure shows a radio receiving system partly in block form embodying an automatic gain control circuit in accordance with the present invention.

Referring now to the single figure of the drawing, there is represented schematically the image signal handling portions of a television signal receiving system of a conventional design and embodying the present invention in a preferred form. In general, the receiving system includes a tuneable radio frequency amplifier and mixer stage 10 having its input circuit connected to an antenna system 11 and having its output circuit connected to an intermediate amplifier section 12. Connected in cascade with the output circuit of the intermediate frequency amplifier section 12, in the order named, are a detector and video amplifier portion 13 and an image reproducing device 14 preferably of the cathode-ray type. Synchronizing signal apparatus 18 is also coupled to the video detector and amplifier portion 13. The synchronizing signal apparatus 18 supplies synchronizing signals to the line scanning generator or deflection apparatus 15 which is adapted to provide energizing current to the deflection coils 16 associated with the kinescope 14. The deflection apparatus 15 is also adapted to provide a keying signal for the automatic gain control generator 17.

The stages or units 10 through 18 inclusive may all be of conventional well-known construction so that the detailed illustrations and descriptions of them are believed unnecessary herein. Referring briefly, however, to the operation of the system described above, television signals are intercepted by the antenna system 11 and are selected and amplified in the radio frequency amplifier and mixer portion 10 to provide a vision signal at the intermediate frequency of the system.

The intermediate frequency vision signals are applied to the intermediate amplifier section 12 for further amplification and are thereafter applied to the video detector and amplifier stages to derive the video frequency modulation components of the vision signal. The modulation components are amplified by the video frequency amplifier and are applied in the usual manner to a brightness control electrode of the image reproducing device 14. The intensity of the electron beam of the tube 14 is thus modulated or controlled in accordance with the video frequency voltages impressed on this control electrode in the usual manner.

The modulation components of the vision signal are also applied to a synchronizing signal apparatus 18 wherein synchronizing components are separated from the vision signal components and the line synchronizing components and field synchronizing components are separated from each other and applied respectively to the different portions of the deflection apparatus 15. Sawtooth current or voltage scanning waves are generated in the deflection apparatus 15 and applied to the scanning elements of the cathode-ray tube 14 to produce electric scanning fields thereby to deflect the electron beam in two directions normal to each other so as to trace a rectangular scanning pattern on the screen of the tube to re-construct the transmitted image.

Referring now particularly to that portion of the system embodying the present invention, a control bias voltage proportional to the amplitude of the received television signal independent of its vision signal components there is developed by an automatic gain control voltage generator device.

This automatic gain control voltage is developed across an anode load circuit comprising the three resistors 22, 23 and 24 which are connected between the anode 25 and a point of fixed reference potential or circuit ground. That portion of the automatic gain control voltage which is developed across the pair of resistors 23 and 24 is applied to an automatic gain control voltage bus 26 for ultimate application to the intermediate frequency amplifier stage or stages 12. The resistor 23 is made variable in order to adjust the amount of the automatic gain control voltage applied to the intermediate frequency amplifier with respect to that developed at the anode 25.

The total automatic gain control voltage which is developed at the anode 25 is applied to an integrating or filter network comprising the series arrangement of a resistor 28 and a capacitor 29. The voltage which is developed across the filter capacitor 29 is applied across one of a pair of diode elements 30 and 31.

A static bias in a forward direction is provided for each of the diode elements 30 and 31 from a source of direct current energizing potential indicated at the terminal B+ which is connected to the diode element 30 through a pair of series resistors 33 and 34. This bias is applied to the anode 35 of the diode element 31 through a resistor 36 which is connected to the junction of the two series resistors 33 and 34. The cathodes 37 and 38 of the diode elements 30 and 31 are connected in common to signal ground.

The negative terminal of the source of direct current energizing potential is also connected to ground. Accordingly, each of these diodes is biased so as to be conducting and thereby each is providing a relatively low impedance from the anode to ground.

The static direct current voltage existing at the anode 35 of the diode element 31 will vary or differ from the direct current static voltage existing at the anode 39 of the diode 30 by an amount equal to the voltage drop existing across the resistors 34 and 36. It may further be seen, that if the resistor 36 is of a larger resistance value than that of the resistor 34, the diode element 31 will normally be conducting a smaller amount of current than the diode element 30.

In one practical embodiment of the circuit provided in accordance with the present invention, the diode elements 30 and 31 comprise the diode portions of a type 6SQ7 vacuum tube and that the resistors 33, 34 and 36 were respectively 1.8 megohms, 15,000 ohms and 330,000 ohms. From these values, it is readily apparent that, the conditions above attributed to this circuit would appertain.

As the carrier level of a television signal received by the television receiving system increases, the negative AGC voltage which is developed at the anode 25 of the AGC generator device 17 increases in a negative direction thereby providing a rising AGC bias voltage which is developed across the resistors 23 and 24 in the anode load circuit and applied by way of the AGC bus 26 to the intermediate frequency amplifier section of the receiving system thereby reducing the gain of this portion of the receiving system. At some value, determined by the selection of circuit components, the negative AGC voltage will be sufficient to apply a reverse bias across the diode element 30 thereby effecting an increase in the impedance of that portion of the AGC circuit designed to apply a bias voltage to the RF amplifier stage or stages of the signal of the receiving system.

The effect of any variation in the impedance offered by the diode element 30 to the AGC circuit will be reduced in its effect upon the action of the diode element 31, due to the fixed voltage increment provided by the voltage drop across the resistor 34. However, at some predetermined AGC voltage level, the diode element 31 will also be biased in a reverse direction thereby effecting the application of an AGC bias voltage to the filter network comprising a resistor 40 which is connected between an anode 35 of the diode element 31 and a control element of the RF amplifier stage or stages, and a pair of capacitors connected between the respective ends of the resistor 40 and signal ground.

Under weak or very low amplitude signal conditions, the RF amplifier bias condition will be less than the bias applied to the intermediate amplifier portion of the receiving system thereby utilizing the maximum available gain of the radio frequency amplifier stage. However, upon the attainment of sufficient signal strength or level to derive an automatic gain control bias of sufficient amplitude to effect a reverse bias across the diode elements 30 and 31, an automatic gain control voltage is applied to the radio frequency amplifier stage of the receiving system thereby effecting a reduction of its gain. Above the signal level, at which the bias on the diode 31 reverses, the increment of bias applied to the radio frequency amplifier stage is greater than that applied to the intermediate frequency amplifier stage for a given unit increase in input signal level. Above some appropriate input signal level, for example, in the order of 3,000 microvolts, the bias applied to the radio frequency amplifier stage exceeds that applied to the intermediate frequency amplifier stages.

Accordingly, the bias condition existing in the receiving system under any signal level is such as to provide maximum utilization of the gain available in all stages of the receiving system while preventing overload of any of the succeeding stages upon high input signal level conditions and to provide sufficient gain in such a manner as to reduce the effectiveness of noise masking on low level signal conditions.

Having thus described the invention, what is claimed is:

1. In a radio signal receiving apparatus including a first and a second signal amplifier for amplifying a received intelligence bearing signal and means for developing an automatic gain control voltage proportional to the amplitude of said signal, an automatic gain control circuit comprising, linear impedance means coupled with said last-named means for applying a predetermined percentage of said control voltage to said first signal amplifier for reducing the effective gain thereof, and a pair of electrically controllable non-linear impedance elements connected with said linear impedance means and sequentially operative for preventing the application of a control voltage to said second signal amplifier below a predetermined threshold.

2. In a signal receiving apparatus adapted to receive and demodulate a radio signal, the combination of a first and a second signal amplifier for amplifying said signals, means for developing an automatic gain control voltage proportional to the amplitude of said signal, linear impedance means coupled with said means for applying a predetermined percentage of said automatic gain control voltage to a control electrode of said first signal amplifier for reducing the effective gain thereof, and a pair of unilaterally conducting means connected with said linear impedance means and adapted to be dependently operative for preventing the application of a control voltage to said second signal amplifier below a predetermined threshold.

3. In a television signal receiving apparatus adapted to receive and demodulate a composite signal having a recurring component designated by a constant peak percentage of radio carrier modulation: the combination of a first and a second signal amplifier for amplifying said signals, generator means for developing an automatic gain control voltage proportional to the amplitude of said recurring component, linear impedance means coupled with said generator means for applying a predetermined percentage of said developed automatic gain control voltage to said first signal amplifier for reducing the effective gain thereof, a first forwardly biased diode element connected with said generator means for preventing the application of a control voltage to said second signal amplifier below a predetermined threshold, and a second diode element having a normally static forward bias determined by the conducting state of said first diode element, said second diode being rendered non-conductive as a rapidly changing function of the changing conductive state of said first diode element.

4. In a signal receiving apparatus the combination comprising, a first signal amplifier and a second signal amplifier adapted to communicate and amplify received signal waves, automatic gain control voltage generating means including a load circuit for deriving a gain control voltage proportional to the amplitude of said waves, first filter means coupled with a portion of said load circuit for applying a predetermined portion of said control voltage to said second signal amplifier, second filter means coupled with said load circuit, a first diode element connected in shunt with said second filter means, means connected for applying a forward static bias across said first element, a second diode element coupled in shunt with said first diode element, means including said bias means for applying a static forward bias across said second element of a smaller magnitude than the bias applied across said first element, and third filter means connected between said second diode element and said first signal amplifier whereby the magnitude and rate of applied control voltage to each of said signal amplifiers is different.

5. In a television signal receiving apparatus including first and second signal amplifier stages adapted to amplify received signal waves and automatic gain control voltage generating means including a load circuit for deriving a gain control voltage proportional to the amplitude of said received signal waves, an automatic gain control circuit comprising, means coupled across a portion of said load circuit for applying a predetermined portion of said control voltage to said second signal amplifier stage, a first diode element connected in shunt with said load circuit and poled to be rendered non-conductive by said control voltage, means connected for applying a forward static bias across said first element whereby in the absence of a control voltage of a magnitude greater than the forward bias voltage said first element is conductive, a second diode element coupled in shunt with a portion of said bias means and said first diode element whereby a static forward bias is applied across said second diode element which is of a smaller magnitude than the bias applied across said first diode element, and circuit means connected between said second diode element and said first signal amplifier stage whereby the magnitude and rate of applied control voltage to each of said signal amplifier is different.

6. In a signal receiving apparatus including first and second signal amplifier stages adapted to amplify a received signal wave and automatic gain control voltage generating means including a resistive load circuit for deriving a gain control voltage proportional to the amplitude of said wave, an automatic gain control circuit comprising, means coupled with a portion of said load circuit for applying a predetermined portion of said control voltage to said second signal amplifier stage, filter means coupled with said load circuit and including a capacitor, a first diode element connected in shunt with said capacitor, a source of direct current bias, a pair of resistors connected in series arrangement between said source and said first diode element for applying a forward static bias across said first diode element, a second diode element, a direct current conductive element connected between said second diode element and the junction of said resistors for applying a static forward bias across said second element of a smaller magnitude than the bias applied across said first element, and second filter means connected between said second filter means and said first signal amplifier whereby the magnitude and rate of applied control voltage to each of said signal amplifier is different.

7. In a signal receiving apparatus including a first signal amplifier stage, a second signal amplifier stage and an automatic gain control voltage generating means including a load circuit for developing a gain control voltage proportional to the amplitude of a received carrier wave, an automatic gain control circuit comprising, circuit means connected with said second signal amplifier stage and across a portion of said load circuit for applying a predetermined portion of said control voltage to said second amplifier stage at a predetermined rate, a unilaterally conducting device connected with said load circuit and poled in a direction to be rendered non-conductive by said control voltage, means for statically biasing said device in a forward direction, a second unilaterally conducting device and an impedance element connected in series arrangement in shunt with the series arrangement of a portion of said bias means and said first unilaterally conducting device whereby said second device is rendered non-conductive in accordance with a rapidly changing function upon the first device being rendered non-conductive, and means coupling said second device with said first signal amplifier stage for applying a delayed pair control voltage thereto.

8. In a signal receiving apparatus including a first signal amplifier stage, a second signal amplifier stage and an automtic gain control voltage generating means including a load circuit for developing a gain control voltage proportional to the amplitude of a received carrier wave, an automatic gain control circuit comprising, circuit means connected with said second signal amplifier stage and across a portion of said load circuit for applying a predetermined portion of said control voltage to said second amplifier stage at a predetermined rate, a first filter network coupled with said load circuit, a diode connected with said first filter network and poled in a direction to be rendered non-conductive by said control voltage, a source of bias, a first and second resistor connected in series arrangement between said source and said diode for statically biasing said diode in a forward direction, a second diode and third resistor connected in series arrangement in shunt with the series arrangement of said second resistor and said first diode, the resistive value of said third resistor being less than that of said second resistor whereby said second device is rendered non-conductive in accordance with a rapidly changing function upon the first device being rendered non-conductive, and means coupling said second device with said first signal amplifier stage for applying a delayed control voltage thereto.

References Cited in the file of this patent

UNITED STATES PATENTS 2,503,900 Burnot ---------------- Apr. 11, 1950